(12) United States Patent
Zhou

(10) Patent No.: US 8,722,549 B2
(45) Date of Patent: May 13, 2014

(54) SEMICONDUCTOR DEVICE CAPABLE OF REDUCING PLASMA INDUCED DAMAGE AND FABRICATION METHOD THEREOF

(75) Inventor: Ming Zhou, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 45 days.

(21) Appl. No.: 13/316,454

(22) Filed: Dec. 9, 2011

(65) Prior Publication Data

US 2013/0056856 A1 Mar. 7, 2013

(30) Foreign Application Priority Data

Sep. 7, 2011 (CN) .......................... 2011 1 0262629

(51) Int. Cl.
 *H01L 21/31* (2006.01)
(52) U.S. Cl.
 USPC ................................. 438/791; 257/E21.334

(58) Field of Classification Search
 USPC ................... 438/775, 778, 791; 257/E21.334
 See application file for complete search history.

(56) References Cited

U.S. PATENT DOCUMENTS

| | | | |
|---|---|---|---|
| 8,274,095 B2* | 9/2012 | Hisamoto | 257/139 |
| 2012/0145237 A1* | 6/2012 | Tanaka et al. | 136/256 |

* cited by examiner

*Primary Examiner* — Quoc Hoang
(74) *Attorney, Agent, or Firm* — Innovation Counsel LLP

(57) ABSTRACT

A method of fabricating a semiconductor device having reduced plasma-induced damage includes providing a p-type semiconductor substrate. The p-type semiconductor substrate has a front surface including the semiconductor device and a back surface. The method further includes doping the back surface with an n-type dopant to form an n-type semiconductor region before forming metal interconnections on the front surface. The n-type semiconductor region and the p-type semiconductor substrate form a pn junction. The method also includes forming an insulation layer on an exposed surface of the n-type semiconductor region.

8 Claims, 3 Drawing Sheets

SEMICONDUCTOR DEVICE CAPABLE OF REDUCING PLASMA INDUCED DAMAGE AND FABRICATION METHOD THEREOF

CROSS-REFERENCES TO RELATED APPLICATIONS

This application claims priority to Chinese Patent Application No. 201110262629.X, filed on Sep. 7, 2011, which is incorporated herein by reference in its entirety.

BACKGROUND OF THE INVENTION

1. Field of the Invention

The present invention relates to a semiconductor device and a fabrication method thereof, and more specifically, the present invention relates to a semiconductor device and a fabrication method thereof that prevent or at least plasma induced damage during the fabrication processes.

2. Description of the Related Art

In the semiconductor fabrication field, plasmas are generally used in various processes such as ion implantation process, chemical vapor deposition process, etching process and photoresist removing process and the like. Theoretically speaking, plasma should exhibit a neutral electrical property to the outside, that is, positive ions and negative ions of the plasma are of equal amount. However, due to an uneven distribution of plasmas, positive ions and negative ions that actually enter into a substrate are not of equal amount at some local areas, which consequently results in a great amount of dissociative charges. Conductors like polysilicon and metal wirings on the substrate would collect these dissociative charges like an antenna, and charges may easily be accumulated on substrate surface. Such charge accumulation may affect the performance of a gate insulation layer, causing various electric parameters (e.g. fixed charges in the insulation layer, interface state density, flat-band voltage, gate leakage current, or the like) of the gate insulation layer to be degraded, and even causing the device to be malfunctioned in extreme cases. This is called "plasma induced damage".

In particular, in the back end of line (BEOL) of an integrated circuit fabrication flow, i.e., during the formation of metal interconnections, plasma induced damage easily occurs because of the use of dielectric chemical vapor deposition (DCVD) process, etching process and physical vapour deposition (PVD) process and the like.

In light of the above problems, it is desirable to provide a semiconductor device structure and a fabrication method thereof to eliminate or reduce plasma induced damage, thereby enhancing the reliability of the semiconductor device.

BRIEF SUMMARY OF THE INVENTION

An object of the present invention is to eliminate or reduce plasma induced damage, thereby enhancing the reliability of a semiconductor device.

According to an embodiment of the present invention, there is provided a method of fabricating a semiconductor device on a p-type semiconductor substrate. The p-type semiconductor substrate has a front surface and a back surface, and the semiconductor device is formed on the front surface of the p-type semiconductor substrate. The method includes, before forming metal interconnections on the front surface of said p-type semiconductor substrate, doping the back surface of the p-type semiconductor substrate with an n-type dopant to form an n-type semiconductor region on the back surface of the p-type semiconductor substrate. The n-type semiconductor region and the p-type semiconductor substrate together form a pn junction.

Preferably, the method further comprises, after forming the n-type semiconductor region and before forming the metal interconnections, forming an insulation layer on an exposed surface of the n-type semiconductor region.

Preferably, the n-type dopant comprises phosphorous ions.

Preferably, doping the back surface of the p-type semiconductor substrate comprises an ion implantation process.

Preferably, the ion implantation process comprises implanting phosphorous ions.

Preferably, the formed n-type semiconductor region has a thickness from about 5 to 10 μm.

Preferably, the step of forming an insulation layer comprises implanting nitrogen ions to the exposed surface of said n-type semiconductor region to form a silicon nitride film.

Preferably, the formed silicon nitride film has a thickness of no more than 5 μm.

Preferably, the semiconductor device comprises a p-type metal oxide semiconductor transistor.

According to another embodiment of the present invention, a semiconductor device includes a p-type semiconductor substrate. The p-type semiconductor substrate has a front surface and a back surface, and the semiconductor device is formed on the front surface of the p-type semiconductor substrate. The semiconductor device includes an n-type semiconductor region formed on the back surface of the p-type semiconductor substrate. The n-type semiconductor region and the p-type semiconductor substrate together form a pn junction.

Preferably, the semiconductor device further includes an insulation layer formed on the n-type semiconductor region.

Preferably, the n-type semiconductor region is doped with phosphorous ions.

Preferably, the n-type semiconductor region has a thickness from about 5 to 10 μm.

Preferably, the insulation layer comprises a silicon nitride film.

Preferably, the silicon nitride film has a thickness of no more than 5 μm.

Preferably, the semiconductor device comprises a p-type metal oxide semiconductor transistor.

Embodiments of the present invention provide many advantages and benefits. In an embodiment, plasma induced damage can be effectively reduced by forming a pn junction on the back surface of the p-type semiconductor substrate, and thus the reliability of the semiconductor device can be enhanced. Furthermore, by further forming an insulation layer in addition to the pn junction on the back surface of the p-type semiconductor substrate, plasma induced damage can be further reduced, and thus the reliability of the semiconductor device can be further enhanced.

Further features of the present invention and advantages thereof will become apparent from the following detailed description of exemplary embodiments according to the present invention with reference to the accompanying drawings.

BRIEF DESCRIPTION OF THE DRAWINGS

With reference to the accompanying drawings, the present invention will be more clearly understood based on the following detailed description. For the sake of clarity, the relative thicknesses of each layer as well as the relative size of any regions in the figures are not necessarily drawn to scale.

DETAILED DESCRIPTION OF THE INVENTION

As described above, during the formation of metal interconnections, the formed metal interconnections may collect charges generated during the time of plasma treatment, and charges may be accumulated on a substrate surface. The accumulated charges can produce an electric potential, thereby forming current that may cause plasma induced damage (also referred as the antenna effect) to the device.

However, while addressing the above problems, the inventor of the present invention has found that, in a p-type semiconductor substrate, a p-type metal oxide semiconductor transistor (hereinafter abbreviated as "PMOS") would more easily have plasma induced damage while an n-type metal oxide semiconductor transistor (hereinafter abbreviated as "NMOS") would not have plasma induced damage. The reasons being that, when the substrate is a p-type semiconductor substrate, n+ region in the NMOS can form a pn junction with the p-type semiconductor substrate, thereby avoiding the generation of a potential. Thus, in order to reduce plasma induced damage in the PMOS, the inventor proposes forming a pn junction on the back surface of the p-type substrate before forming metal interconnections. This technique prevents the generation of plasma induced potential in the PMOS, and thus reduces plasma induced damage.

Further, the inventor of the present invention has also found that, after the formation of the pn junction on the back surface of the p-type substrate, plasma induced damage can be further reduced by further forming an insulation layer on the back surface of the p-type substrate.

Various exemplary embodiments of the present invention will be described in detail with reference to the accompanying drawings.

The following description of the exemplary embodiments is merely illustrative in nature and is in no way intended to limit the invention, its applications or uses. Technologies well known in the art can be applied to parts that are not specifically illustrated or described.

Embodiments of the present invention provide a semiconductor device that is formed on a p-type semiconductor substrate and capable of reducing plasma induced damage. The semiconductor device is formed on a front surface of the p-type semiconductor substrate, and an n-type semiconductor region is formed on a back surface of the p-type semiconductor substrate so that the n-type semiconductor region forms a pn junction with the p-type semiconductor substrate. In addition, the semiconductor device further includes an insulation layer that is formed on the n-type semiconductor region to further reduce plasma induced damage.

A method of fabricating a semiconductor device that is capable of reducing plasma induced damage will be described in detail below, with reference to FIGS. 1 and 2.

Figure 1:
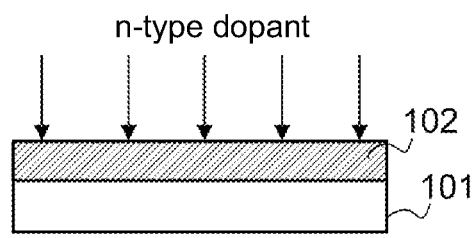
FIG. 1 is a cross-sectional schematic diagram of a semiconductor device at the time of doping the back surface of the p-type semiconductor substrate with n-type dopant according to one embodiment of the present invention.

FIG. 1 is a cross-sectional schematic diagram of a semiconductor device according to an embodiment of the present invention. As shown, the back surface 102 of a p-type semiconductor substrate 101 is doped with an n-type dopant.

Figure 2:
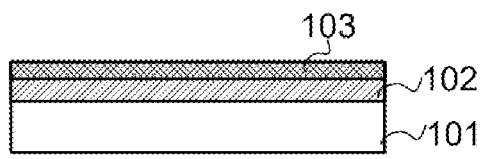
FIG. 2 is a cross-sectional schematic diagram of a semiconductor device at the time of forming an insulation layer after the formation of the n-type semiconductor region according to another embodiment of the present invention.

FIG. 2 is a cross-sectional schematic diagram of a semiconductor device according to another embodiment of the present invention. As shown, an insulation layer 103 is formed on the doped back surface after the formation of the n-type semiconductor region.

According to embodiments of the present invention, the steps of forming an n-type semiconductor region and an insulation layer on the back surface of the p-type semiconductor substrate may include treatments of the back surface of the p-type semiconductor substrate. The treatments can be performed either before or after the processes of forming a semiconductor device prior to forming metal interconnections. Therefore, for the sake of simplicity and clarity, FIGS. 1 and 2 only show the p-type semiconductor substrate 101, and do not show a structure of a semiconductor device that may be formed on the front surface of the p-type semiconductor substrate 101. Note that, the steps of forming an n-type semiconductor region and an insulation layer both must be performed before the formation of metal interconnections to avoid plasma induced damage that is mainly caused by the formed metal interconnections. In an embodiment, the semiconductor device is a PMOS device.

(One Embodiment of a Fabrication Method of Semiconductor Device)

With reference to FIG. 1, the p-type semiconductor substrate 101 is shown with the front surface of the p-type semiconductor substrate 101 facing downward while the back surface thereof facing upward. The semiconductor device is formed on the front surface of the p-type semiconductor substrate 101. According to one embodiment of the present invention, before forming metal interconnections on the front surface of the p-type semiconductor substrate 101, the back surface of p-type semiconductor substrate 101 is doped with n-type dopant to form an n-type semiconductor region 102 on the back surface of the p-type semiconductor substrate 101. The n-type semiconductor region 102 and the p-type semiconductor substrate 101 together form a pn junction.

The n-type semiconductor region 102 can be formed by implanting n-type dopant by means of an ion implantation method, in an example embodiment. The n-type dopant can be phosphorous ions, and the n-type semiconductor region 102 can be formed by implanting phosphorous ions by means of an ion implantation method. The formed n-type semiconductor region 102 can have a thickness from about 5 to 10 μm, in an example embodiment. One of ordinary skill in the art should appreciate that the n-type dopant is not limited to phosphorous ions and instead can be any other dopants, e.g., arsenic ions, that can change a back surface region of the p-type semiconductor substrate 101 into an n-type semiconductor region.

(Another Embodiment of a Fabrication Method of Semiconductor Device)

In addition, according to another embodiment of the present invention, as shown in FIG. 2, after forming the n-type semiconductor region 102 as described above and before the formation of metal interconnections, it is preferable to further form an insulation layer 103 on an exposed surface of the n-type semiconductor region 102. Likewise, the p-type semiconductor substrate 101 is also shown with the back surface facing up in FIG. 2.

For example, nitrogen ions can be implanted to the exposed surface of the n-type semiconductor region 102 by means of an ion implantation method to form a silicon nitride film which can serve as the insulation layer 103. The formed silicon nitride film can have a thickness of no more than 5 μm, in an example embodiment. In addition, a silicon oxide layer can be formed on a surface of the n-type semiconductor region 102 by means of an oxidation process or the like, thereby forming the insulation layer 103. The insulation layer 103 can have a thickness of no more than 5 μm, for example.

Finally, as shown in FIG. 2, a pn junction and an insulation layer are formed on the back surface of the p-type semiconductor substrate 101.

Figure 3A:
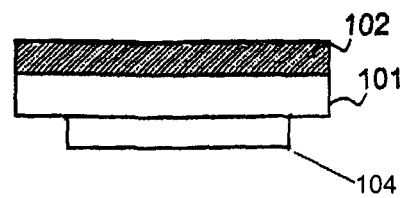
FIG. 3A is a cross-sectional schematic diagram of a semiconductor device with a metal interconnection after doping the back surface of the p-type semiconductor substrate with n-type dopant according to one embodiment of the present invention.
Figure 3B:
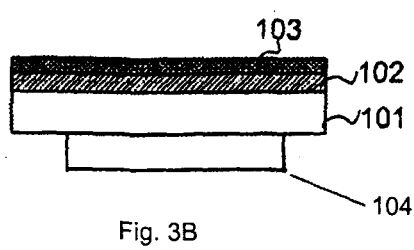
FIG. 3B is a cross-sectional schematic diagram of a semiconductor device with a metal interconnection after forming an insulation layer after the formation of the n-type semiconductor regions according to another embodiment of the present invention.
Figure 4A:
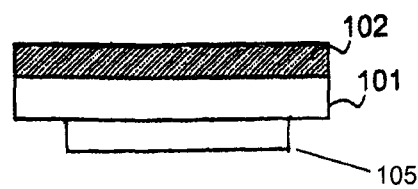
FIG. 4A a cross-sectional schematic diagram of a semiconductor device with a PMOS after doping the back surface of the p-type semiconductor substrate with n-type dopant according to one embodiment of the present invention.
Figure 4B:
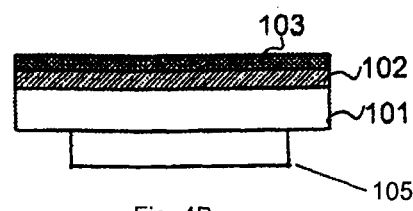
FIG. 4B is a cross-sectional schematic diagram of a semiconductor device with a PMOS after forming an insulation layer after the formation of the n-type semiconductor regions according to another embodiment of the present invention.

Note that, the above-described step of forming an n-type semiconductor region and the above-described step of forming an insulation layer as shown in FIGS. 1 and 2 must be performed before forming, as shown in FIGS. 3A and 3B, metal interconnections 104 over the semiconductor device. As shown in FIGS. 4A and 4B, in an embodiment, the semiconductor device is a PMOS device 105.

In summary, as described above, according to the present invention, plasma induced damage can be effectively reduced by forming a pn junction on the back surface of the p-type substrate, thereby enhancing the reliability of the semiconductor device. In addition, by further forming an insulation layer on the pn junction, plasma induced damage can be further reduced.

While the present invention has been described in detail with reference to exemplary embodiments, it should be understood by a person skilled in the art that the above exemplary embodiments are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method of fabricating a semiconductor device on a p-type semiconductor substrate, wherein said p-type semiconductor substrate has a front surface and a back surface, said semiconductor device is formed on the front surface of said p-type semiconductor substrate, said method comprising:

before forming metal interconnections on the front surface of said p-type semiconductor substrate, doping the back surface of said p-type semiconductor substrate with an n-type dopant to form an n-type semiconductor region on the back surface of said p-type semiconductor substrate, wherein said n-type semiconductor region and said p-type semiconductor substrate together form a pn junction, and after the formation of the n-type semiconductor region and before forming metal interconnections, forming an insulation layer on an exposed surface of said n-type semiconductor region, wherein forming the insulating layer comprises implanting nitrogen ions to the exposed surface of the n-type semiconductor region to form a silicon nitride film.

2. The method according to claim 1, wherein the formed silicon nitride film has a thickness of no more than 5 μm.

3. The method according to claim 1, wherein said n-type dopant comprises phosphorous ions.

4. The method according to claim 1, wherein doping the back surface of said p-type semiconductor substrate comprises an ion implantation method.

5. The method according to claim 4, wherein the ion implantation method comprises implanting phosphorous ions.

6. The method according to claim 1, wherein the formed n-type semiconductor region has a thickness from about 5 to 10 μm.

7. The method according to claim 1, wherein said semiconductor device comprises a p-type metal oxide semiconductor transistor.

8. A method of fabricating a semiconductor device on a p-type semiconductor substrate, wherein said p-type semiconductor substrate has a front surface and a back surface, said semiconductor device is formed on the front surface of said p-type semiconductor substrate, said method comprising:

before forming metal interconnections on the front surface of said p-type semiconductor substrate, doping the back surface of said p-type semiconductor substrate with an n-type dopant to form an n-type semiconductor region on the back surface of said p-type semiconductor substrate, wherein said n-type semiconductor region and said p-type semiconductor substrate together form a pn junction, wherein the formed n-type semiconductor region has a thickness from about 5 to 10 um.

* * * * *